(12) United States Patent
Lin et al.

(10) Patent No.: US 10,879,194 B2
(45) Date of Patent: Dec. 29, 2020

(54) SEMICONDUCTOR DEVICE PACKAGE AND METHOD OF MANUFACTURING THE SAME

(71) Applicant: TAIWAN SEMICONDUCTOR MANUFACTURING COMPANY LTD., Hsinchu (TW)

(72) Inventors: Jing-Cheng Lin, Hsinchu (TW); Li-Hui Cheng, New Taipei (TW); Po-Hao Tsai, Taoyuan County (TW); Jeh-Yin Chang, Hsinchu (TW); Li-Chung Kuo, Taipei (TW); Hsien-Ju Tsou, Taipei (TW); Yi Chou, New Taipei (TW); Ying-Ching Shih, Hsinchu (TW); Szu-Wei Lu, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 15 days.

(21) Appl. No.: 15/605,450

(22) Filed: May 25, 2017

(65) Prior Publication Data
US 2018/0342466 A1 Nov. 29, 2018

(51) Int. Cl.
*H01L 23/28* (2006.01)
*H01L 23/00* (2006.01)
(Continued)

(52) U.S. Cl.
CPC ........ *H01L 23/562* (2013.01); *H01L 21/4853* (2013.01); *H01L 21/56* (2013.01); *H01L 21/563* (2013.01); *H01L 23/3185* (2013.01); *H01L 23/367* (2013.01); *H01L 23/3737* (2013.01); *H01L 23/552* (2013.01); *H01L 23/585* (2013.01); *H01L 24/32* (2013.01); *H01L 23/49816* (2013.01); *H01L 24/16* (2013.01);
(Continued)

(58) Field of Classification Search
None
See application file for complete search history.

(56) References Cited

U.S. PATENT DOCUMENTS

| 5,942,798 A | * | 8/1999 | Chiu | ............ H01L 21/563 257/737 |
| 8,802,504 B1 | | 8/2014 | Hou et al. | |

(Continued)

FOREIGN PATENT DOCUMENTS

KR  20180024828 A  *  3/2018  ............. G09G 3/006

OTHER PUBLICATIONS

Title: KR 20180024828 A Machine Translation Translated date: Apr. 13, 2020 Publisher: European Patent office Pertinent Page: pp. 1-28 (Year: 2020).*

*Primary Examiner* — Joseph C. Nicely
*Assistant Examiner* — Lamont B Koo
(74) *Attorney, Agent, or Firm* — WPAT, P.C., Intellectual Property Attorneys; Anthony King

(57) ABSTRACT

A semiconductor device package includes a substrate, a semiconductor chip, a first ring structure and a second ring structure. The substrate includes a surface. The semiconductor chip is over the surface of the substrate. The first ring structure is over the surface of the substrate. The second ring structure is over the surface of the substrate, wherein the first ring structure is between the semiconductor chip and the second ring structure.

20 Claims, 18 Drawing Sheets

(51) Int. Cl.
*H01L 23/31* (2006.01)
*H01L 23/58* (2006.01)
*H01L 21/48* (2006.01)
*H01L 21/56* (2006.01)
*H01L 23/552* (2006.01)
*H01L 23/367* (2006.01)
*H01L 23/373* (2006.01)
*H01L 23/498* (2006.01)

(52) U.S. Cl.
CPC .... *H01L 24/83* (2013.01); *H01L 2224/16227* (2013.01); *H01L 2224/26175* (2013.01); *H01L 2224/73204* (2013.01); *H01L 2224/83104* (2013.01); *H01L 2924/15311* (2013.01); *H01L 2924/1715* (2013.01); *H01L 2924/1779* (2013.01); *H01L 2924/19105* (2013.01)

(56) References Cited

U.S. PATENT DOCUMENTS

| | | | |
|---|---|---|---|
| 8,803,292 B2 | 8/2014 | Chen et al. | |
| 8,803,316 B2 | 8/2014 | Lin et al. | |
| 8,993,380 B2 | 3/2015 | Hou et al. | |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,496,189 B2 | 11/2016 | Yu et al. | |
| 2003/0042852 A1* | 3/2003 | Chen | H01L 51/5246 313/512 |
| 2008/0179738 A1* | 7/2008 | Nishimura | H01L 21/563 257/737 |
| 2010/0157412 A1* | 6/2010 | Lee | G02F 1/167 359/296 |
| 2010/0258346 A1* | 10/2010 | Chen | H01L 21/56 174/521 |
| 2011/0204476 A1* | 8/2011 | Kang | H01L 21/563 257/532 |
| 2012/0270370 A1* | 10/2012 | Ihara | H01G 2/065 438/123 |
| 2016/0118427 A1* | 4/2016 | Hsu | H01L 27/14618 257/434 |
| 2016/0368015 A1* | 12/2016 | Ueda | B41J 2/175 |

* cited by examiner

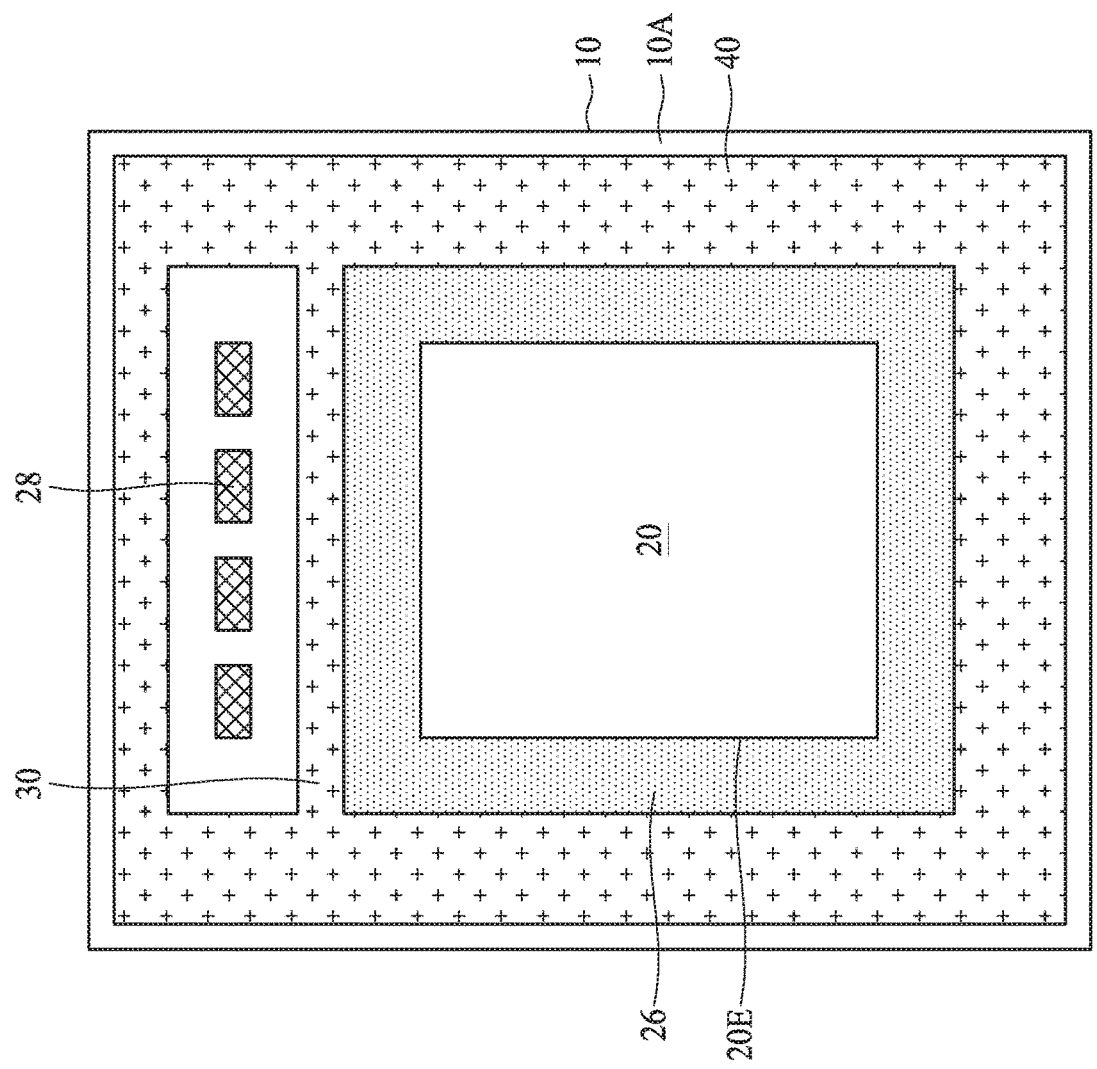

SEMICONDUCTOR DEVICE PACKAGE AND METHOD OF MANUFACTURING THE SAME

BACKGROUND

In the packaging of integrated circuits, semiconductor dies may be stacked through bonding, and may be bonded to other package components such as interposers and package substrates. The resulting packages are known as Three-Dimensional Integrated Circuits (3DICs). Warpage, coplanarity and underfill crack issues, however, are challenges in the 3DICs.

BRIEF DESCRIPTION OF THE DRAWINGS

Aspects of the embodiments of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

FIG. 7A and FIG. 7B are schematic views of a semiconductor device package according to one or more embodiments of the present disclosure.

DETAILED DESCRIPTION

Figure 1:
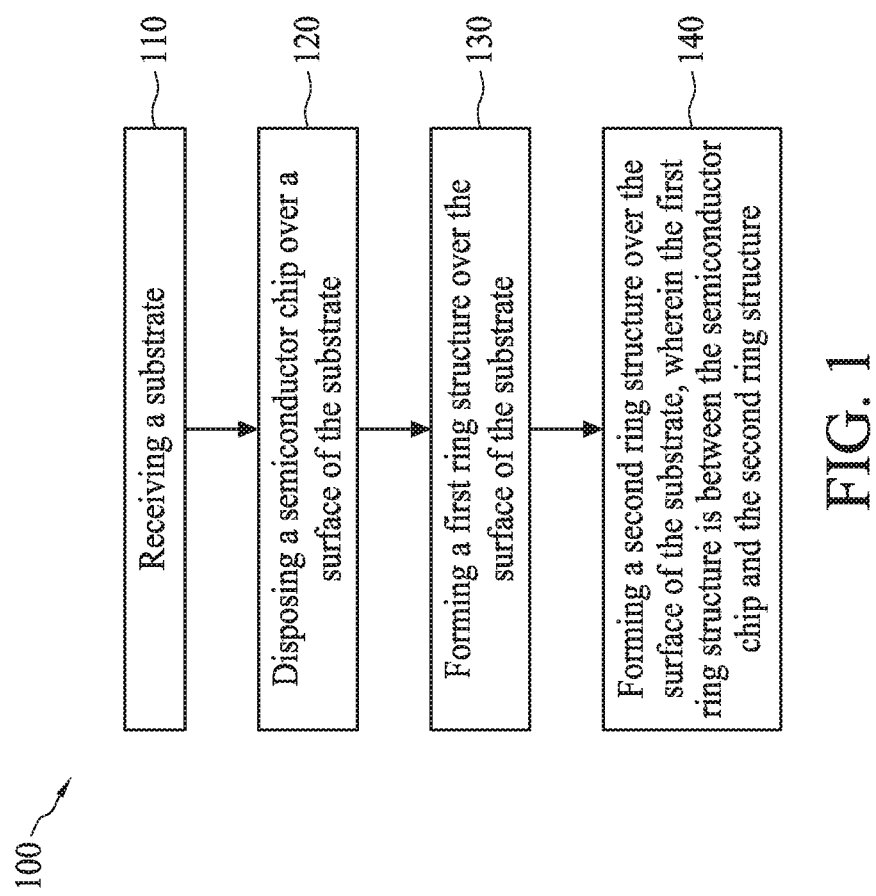
FIG. 1 is a flow chart illustrating a method of manufacturing a semiconductor device package according to various aspects of one or more embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "above", "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first", "second" and "third" describe various elements, components, regions, layers and/or sections, these elements, components, regions, layers and/or sections should not be limited by these terms. These terms may be only used to distinguish one element, component, region, layer or section from another. The terms such as "first", "second" and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In some embodiments of the present disclosure, the semiconductor device package includes a ring structure formed over a substrate and adjacent to a semiconductor chip. The ring structure may be configured to constrain an underfill layer, to compensate the stress on the substrate induced by other components, and/or compensate CTE mismatch between the substrate and other components.

As used herein, the term "ring structure" refers to a structure that substantially confines a space. In some embodiments, the ring structure may be a continuous ring structure which has a continuous perimeter. In some embodiments, the ring structure may include several segmented pieces. In some embodiments, the ring structure may be insulative. In some embodiments, the ring structure may be conductive, and may be grounded or supplied with a potential.

FIG. 1 is a flow chart illustrating a method of manufacturing a semiconductor device package according to various aspects of one or more embodiments of the present disclosure. The method 100 begins with operation 110 in which a substrate is received. The method proceeds with operation 120 in which a semiconductor chip is disposed over a surface of the substrate. In some embodiments, the semiconductor chip is electrically connected to the substrate with electrically connectors such as conductive bumps. In some embodiments, an underfill layer is formed between the semiconductor chip and the substrate. The method proceeds with operation 130 in which a first ring structure is formed over the surface of the substrate. In some embodiments, the first ring structure is a polymer ring structure. In some embodiments, the first ring structure is formed by selectively dispensing a photo-curable material over the surface of the substrate and irradiating the photo-curable material simultaneously. The method proceeds with operation 140 in which a second ring structure is formed over the surface of the substrate, wherein the first ring structure is between the semiconductor chip and the second ring structure. In some embodiments, the second ring structure is formed by attaching a conductive ring structure to the surface of the substrate with an adhesive layer.

The method 100 is merely an example, and is not intended to limit the present disclosure beyond what is explicitly recited in the claims. Additional operations can be provided before, during, and after the method 100, and some operations described can be replaced, eliminated, or moved around for additional embodiments of the method.

Figure 2A:
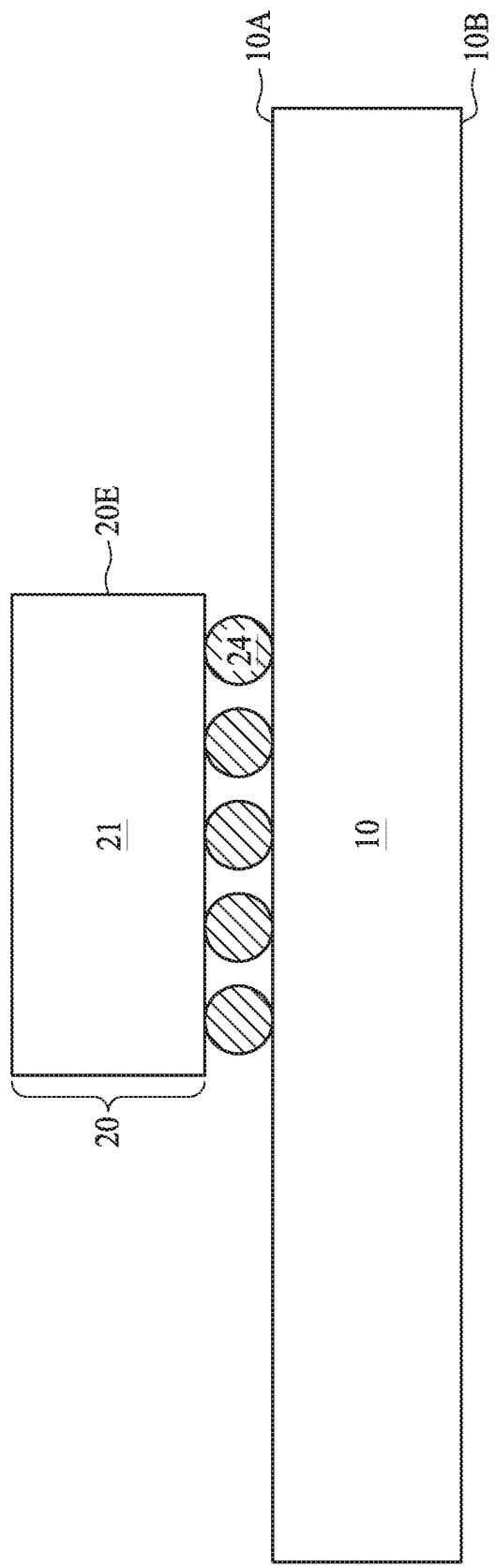
FIG. 2A, FIG. 2B, FIG. 2C, FIG. 2D, FIG. 2E and FIG. 2F are schematic views at one of various operations of manufacturing a semiconductor device package according to one or more embodiments of the present disclosure.
Figure 2B:
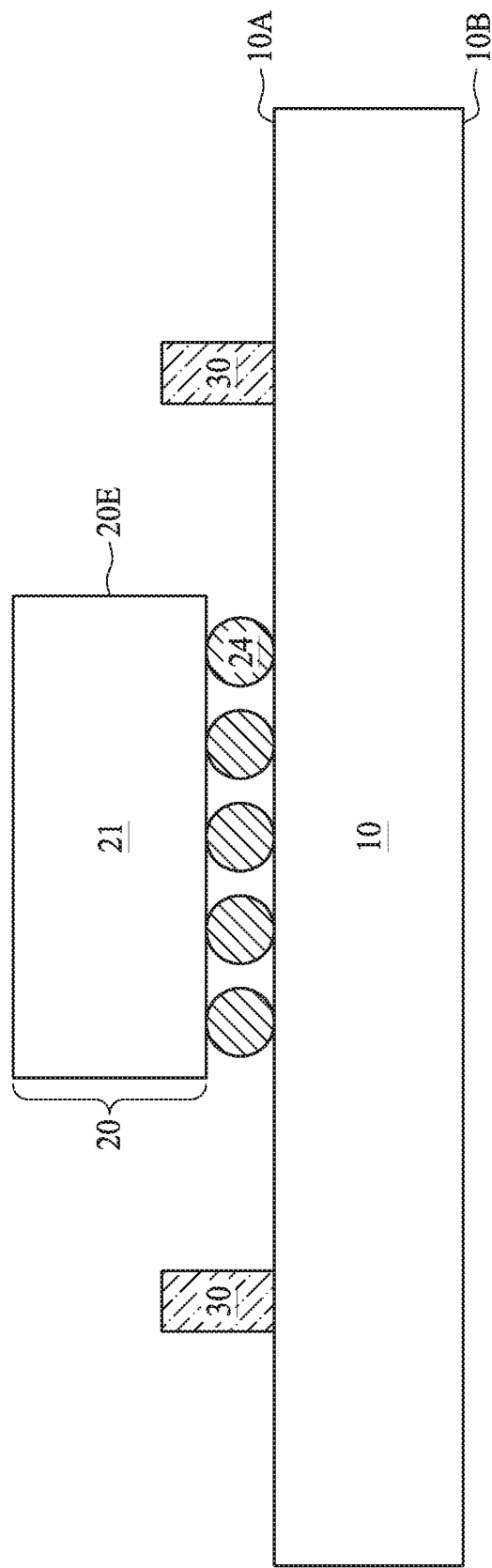
Figure 2C:
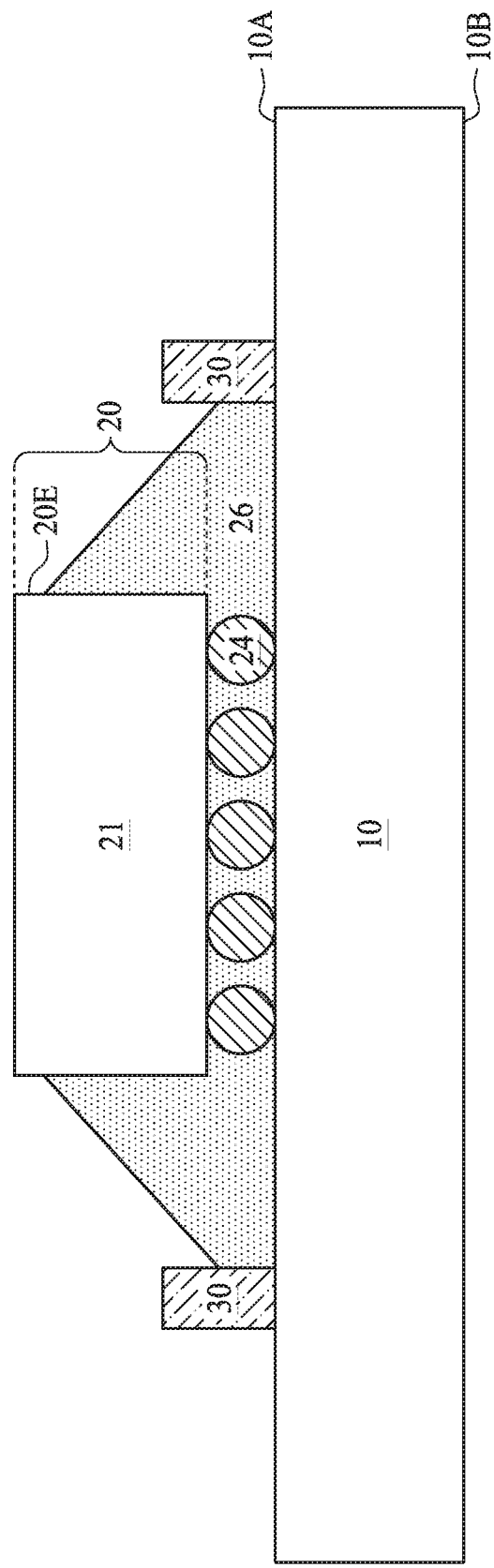
Figure 2D:
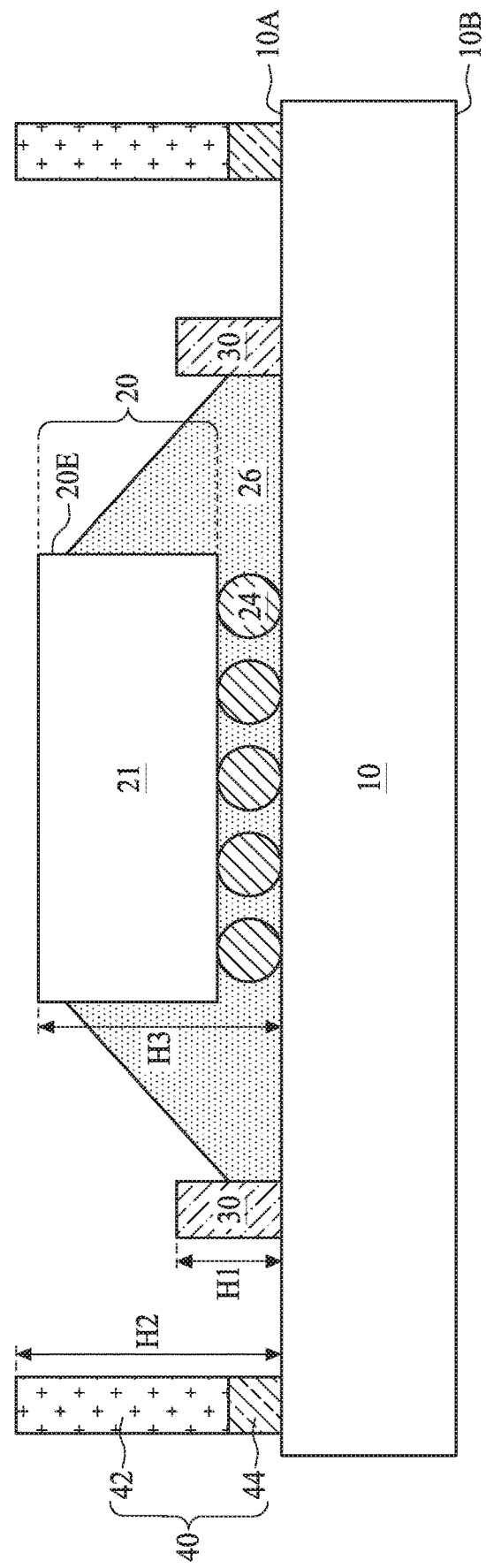
Figure 2E:
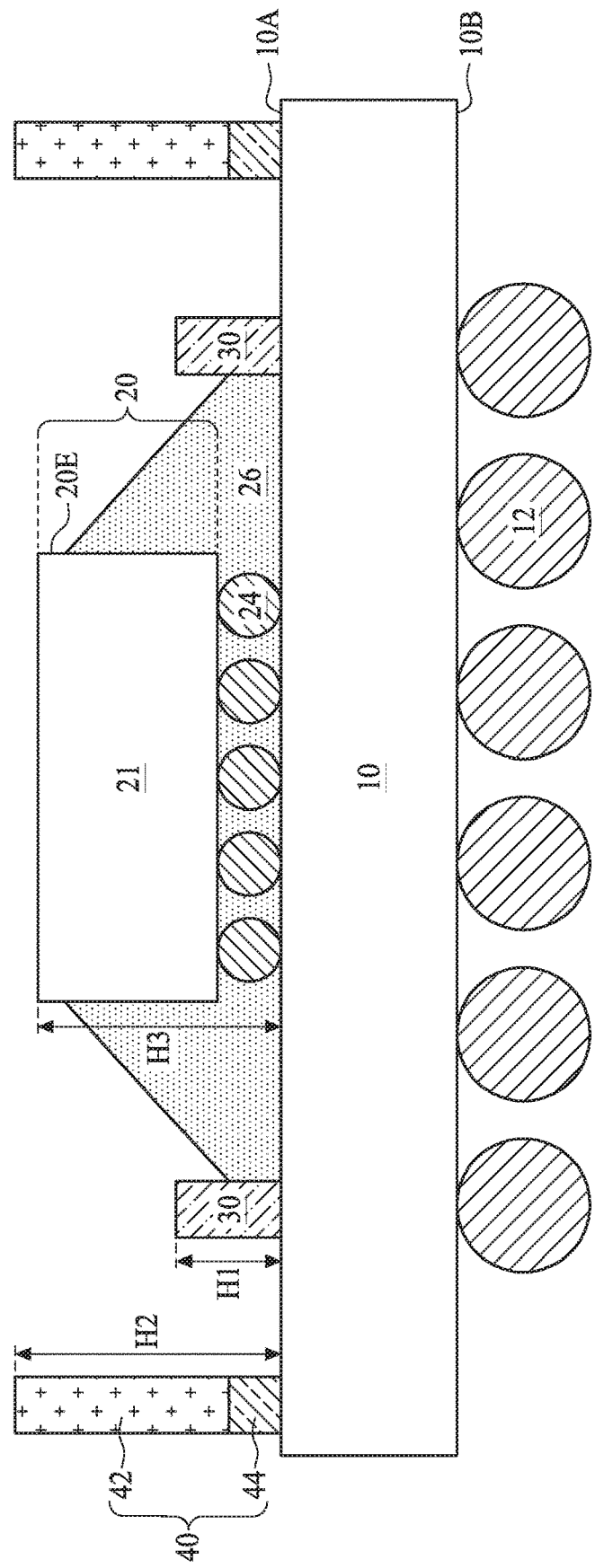
Figure 2F:
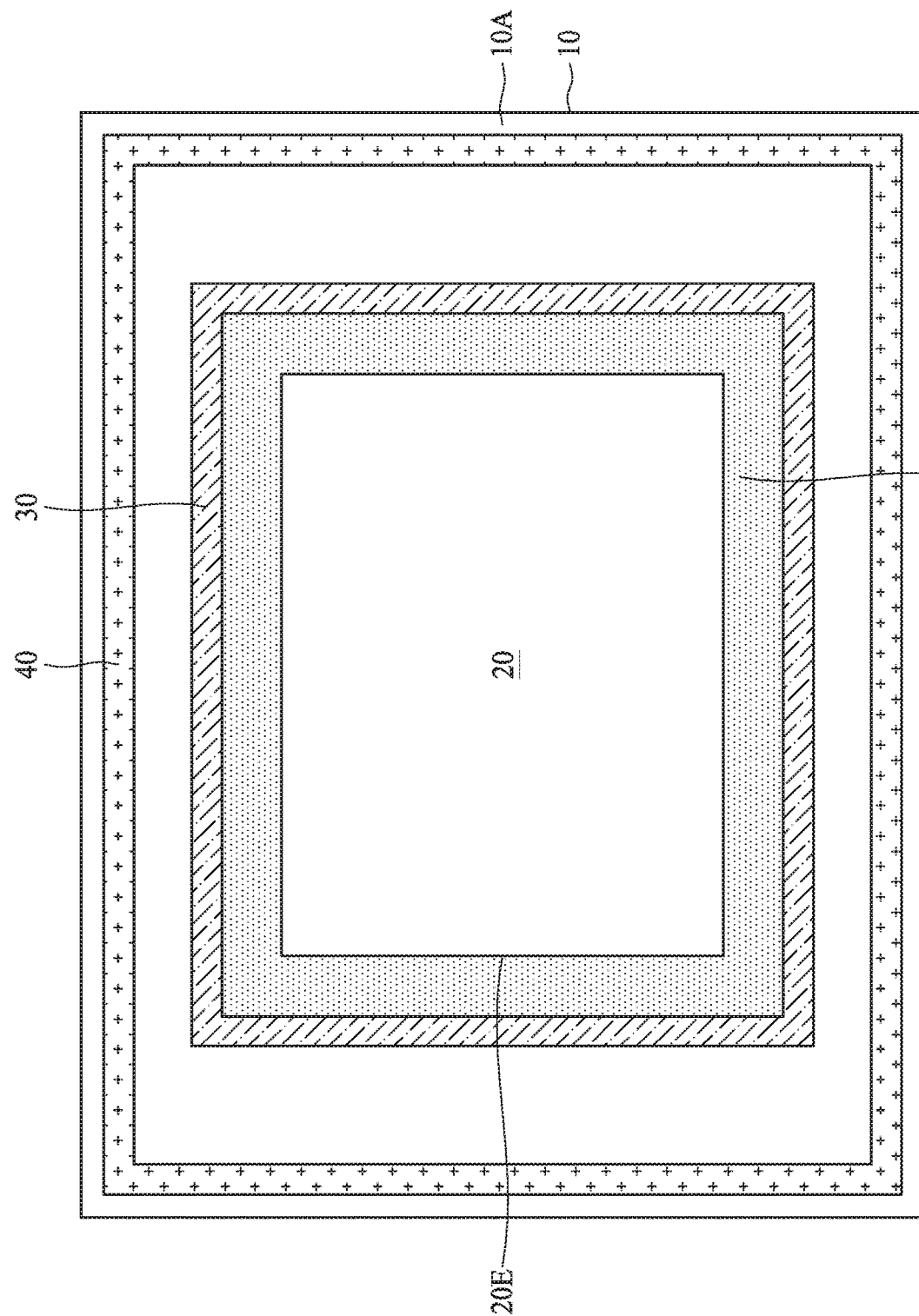

FIG. 2A, FIG. 2B, FIG. 2C, FIG. 2D, FIG. 2E and FIG. 2F are schematic views at one of various operations of manufacturing a semiconductor device package according to one or more embodiments of the present disclosure, where FIG. 2A, FIG. 2B, FIG. 2C, FIG. 2D and FIG. 2E are schematic cross-sectional views, and FIG. 2F is a schematic top view. As depicted in FIG. 2A, a substrate 10 is received. In some embodiments, the substrate 10 may include a semiconductor substrate, a package substrate, a printed circuit board (PCB) or the like. The substrate 10 includes a surface 10A, and another surface 10B opposite to the surface 10A. In some embodiments, the substrate 10 includes a circuit layer such as through vias, conductive pillars, conductive posts, redistribution layer(s), or the like, or a combination thereof, configured to electrically interconnect different electronic devices disposed on the opposite surfaces 10A and 10B. One or more semiconductor chips 20 are disposed over the surface 10A of the substrate 10. In some embodiments, the semiconductor chip 20 is electrically connected to the substrate 10. In some embodiments, the semiconductor chip 20 is electrically connected to the substrate 10 through first electrical conductors 24. In some embodiments, the first electrical conductors 24 may include conductive bumps such as C4 bumps, conductive balls, conductive pastes, or the like. In some embodiments, the semiconductor chip 20 may include one or more semiconductor dies 21, integrated fan out (InFO) dies, or other suitable dies. In some embodiments, the semiconductor chip 20 may be referred to as a chip-on-wafer (CoW) structure.

As depicted in FIG. 2B, a first ring structure 30 is formed over the surface 10A of the substrate 10. In some embodiments, the first ring structure 30 may include a continuous ring structure spaced from an edge 20E of the semiconductor chip 20, but substantially surrounding the edge 20E of the semiconductor chip 20. In some embodiments, the shape of the first ring structure 30 may include a rectangular ring, but not limited thereto. In some embodiments, the width of the first ring structure 30 may be substantially ranging from about 40 micrometers to about 3 millimeters, but is not limited thereto. In some embodiments, the first ring structure 30 includes an insulative ring structure such as a polymer ring structure or the like. In some embodiments, the material of the polymer ring structure may include, but is not limited to, acrylic resin, epoxy, polyimide (PI), polybenzoxazole (PBO) or the like. In some embodiments, the first ring structure 30 is formed by selectively dispensing a photo-curable material such as acrylic resin or epoxy over the surface 10A of the substrate 10 and irradiating the photo-curable material simultaneously. In some embodiments, the photo-curable material is selectively dispensed on the substrate 10 by printing such as inkjet printing. In some embodiments, the photo-curable material is irradiated by UV beams while dispensing to reduce the fluidity of the photo-curable material. In some embodiments, the first ring structure 30 may be formed by repeating the photo-curable material dispensing and irradiation several cycles to obtain a desired thickness. In some embodiments, the dimension of the first ring structure 30 such as the area in contact with the substrate 10, and the pattern of the first ring structure 30 are configured to compensate the stress. By way of example, more than one first ring structure 30 may be formed over the surface 10A of the substrate 10.

As depicted in FIG. 2C, an underfill layer 26 is formed between the semiconductor chip 20 and the substrate 10. In some embodiments, the first ring structure 30, which is formed prior to formation of the underfill layer 26, may be configured as a dam to constrain the underfill layer 26. The first ring structure 30 may help to reduce the amount and area of the underfill layer 26, and may alleviate the stress on the substrate 10 induced by the underfill layer 26. The first ring structure 30 may also help the underfill layer 26 to climb up to at least a portion of the edge 20E of the semiconductor chip 20, thereby helping to protect and fix the semiconductor chip 20. In some embodiments, the first ring structure 30 helps compensate CTE mismatch between the underfill layer 26 and the substrate 10, and helps compensate stress on the substrate 10, such that coplanarity (COP) of the substrate 10 can be reduced, i.e., the flatness of the substrate 10 is improved. As a result, warpage of the substrate 10 can be alleviated, underfill crack risk can be reduced, and cold joint and bump crack of the first electrical conductors 24 between the semiconductor chip 20 and the substrate 10 can be alleviated or eliminated.

As depicted in FIG. 2D, a second ring structure 40 is formed over the substrate 10. In some embodiments, the second ring structure 40 is adjacent to a perimeter of the substrate 10, and the first ring structure 30 is between the semiconductor chip 20 and the second ring structure 40. In some embodiments, the second ring structure 40 may include a continuous ring structure substantially aligned along the perimeter of the substrate 10. In some embodiments, the shape of the second ring structure 40 may include a rectangular ring, but not limited thereto. In some embodiments, the second ring structure 40 may include a conductive ring structure 42 such as a metal ring structure or the like. In some embodiments, the second ring structure 40 may be grounded or supplied with a potential. In some embodiments, the conductive ring structure 42 is attached to the surface 10A of the substrate 10 with an adhesive layer 44. In some embodiments, the adhesive layer 44 may include a thermal-curable adhesive or a photo-curable adhesive, and a thermal curing or a photo curing may be performed to enhance adhesion between the conductive ring structure 42 and the substrate 10. In some embodiments, the second ring structure 40 is configured to enhance robustness of the edge of the substrate 10. In some embodiments, the second ring structure 40 is configured to shield electromagnetic interference (EMI). In some embodiments, the second ring structure 40 is configured to provide heat dissipation for the semiconductor chip 20.

In some embodiments, the first ring structure 30 has a first height H1 measuring from the surface 10A of the substrate 10, the second ring structure 40 has a second height H2 measuring from the surface 10A of the substrate 10, and the semiconductor chip 20 has a third height H3 measuring from the surface 10A of the substrate 10. In some embodiments, the second height H2 of the second ring structure 40 is higher than the third height H3 of the semiconductor chip 20, and the first height H1 of the first ring structure 30 is lower than the third height H3 of the semiconductor chip 20. In some embodiments, the first height H1 of the first ring structure 30 may be substantially ranging from about 10 micrometers to about 1 millimeter, but is not limited thereto. In some embodiments, the first ring structure 30 is softer and more flexible than the second ring structure 40.

As depicted in FIG. 2E and FIG. 2F, second electrical conductors 12 may be formed over the surface 10B of the substrate 10 to manufacture a semiconductor device package 1. In some embodiments, the second electrical conductors 12 are electrically connected to the semiconductor chip 20 through circuit layers in the substrate 10 and the first electrical conductors 24. In some embodiments, the second electrical conductors 12 are configured build an electrical connection external to the semiconductor chip 20. In some embodiments, the semiconductor device package 1 may be, but is not limited to, a chip-on-wafer-on-substrate (CoWoS) package.

The semiconductor device package and its manufacturing method of the present disclosure are not limited to the above-mentioned embodiments, and may have other different embodiments. To simplify the description and for the convenience of comparison between each of the embodiments of the present disclosure, the identical components in each of the following embodiments are marked with identical numerals. For making it easier to compare the difference between the embodiments, the following description will detail the dissimilarities among different embodiments and the identical features will not be redundantly described.

Figure 3A:
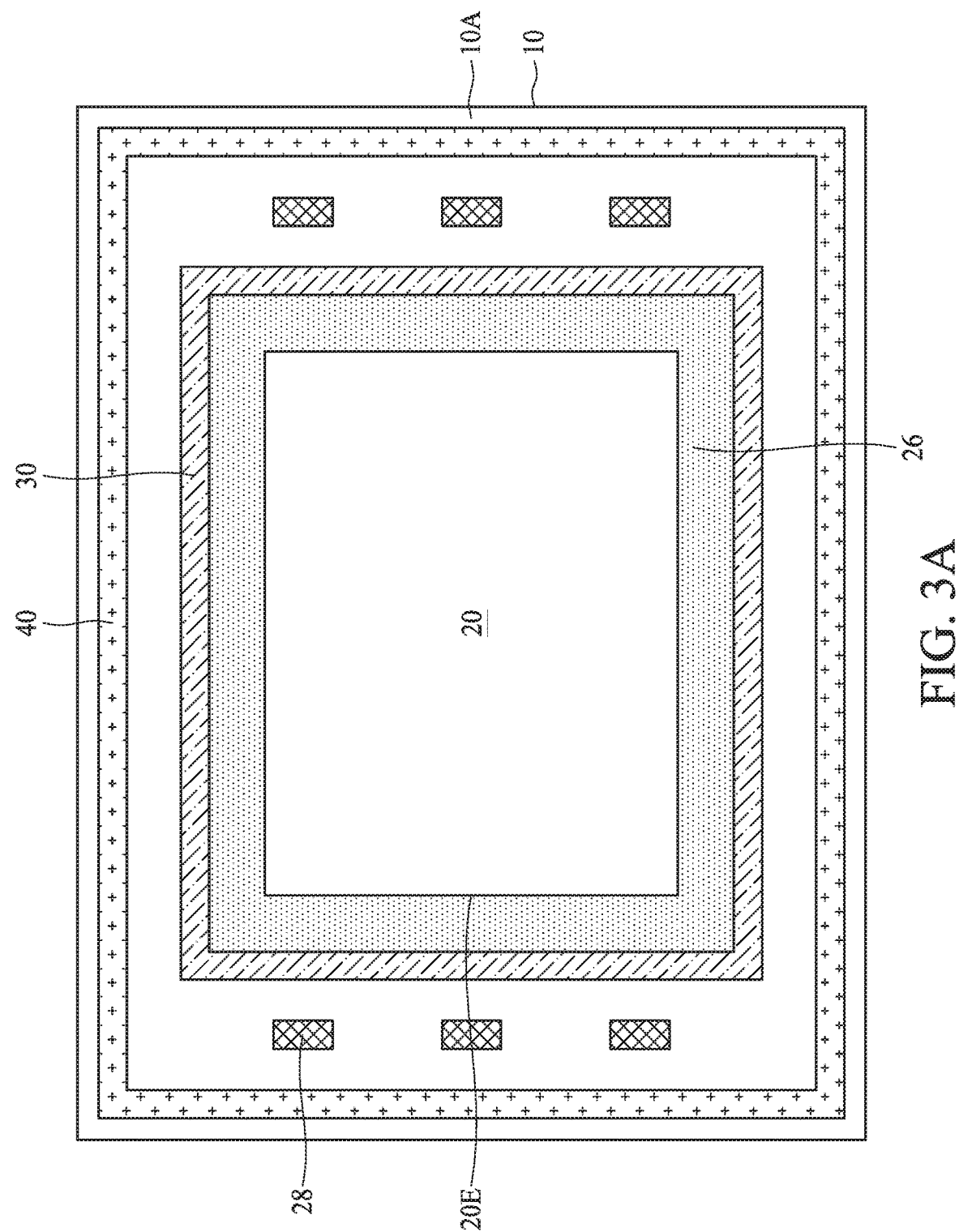
FIG. 3A and FIG. 3B are schematic views of a semiconductor device package according one or more embodiments of the present disclosure.
Figure 3B:
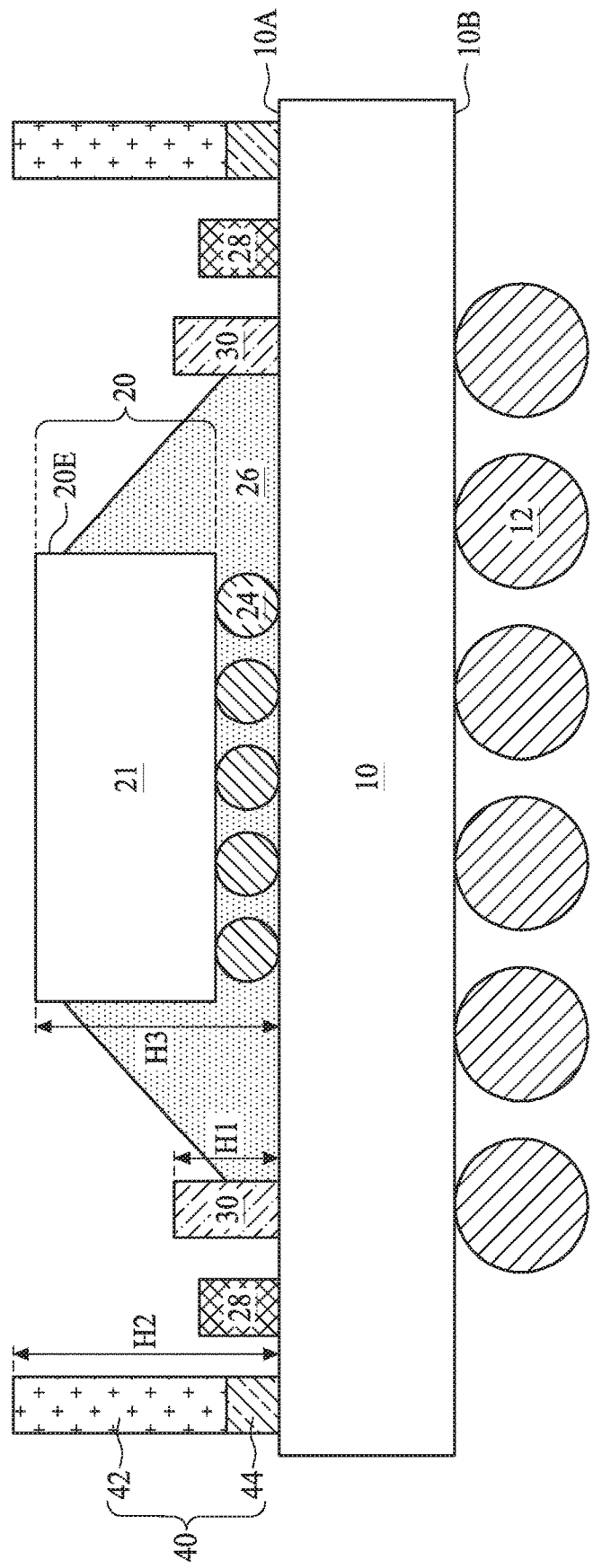

FIG. 3A and FIG. 3B are schematic views of a semiconductor device package according to one or more embodiments of the present disclosure, where FIG. 3A is a schematic top view, and FIG. 3B is a schematic cross-sectional view. As depicted in FIG. 3A and FIG. 3B, the semiconductor device package 2 may further include at least one passive component 28 over the surface 10A of the substrate 10. In some embodiments, the passive component 28 is disposed between the first ring structure 30 and the second ring structure 40. In some embodiments, the first ring structure 30 is configured as a dam to block the underfill layer 26 from creeping or bleeding to the passive component 28, so as to protect the passive component 28. In some embodiments, the passive components 28 may be disposed at one side, two sides, three sides or four sides of the first ring structure 30. In some embodiments, the passive component 28 may include a resistor component, a capacitor component, an inductor component or combinations thereof. In some embodiments, the first ring structure 30 is configured to compensate CTE mismatch between the underfill layer 26 and the substrate 10, and to compensate stress on the substrate 10, such that coplanarity (COP) of the substrate 10 is reduced. As a result, warpage of the substrate 10 can be alleviated, underfill crack risk can be reduced, and cold joint and bump crack of the first electrical conductors 24 between the semiconductor chip 20 and the substrate 10 can be alleviated or eliminated.

Figure 4A:
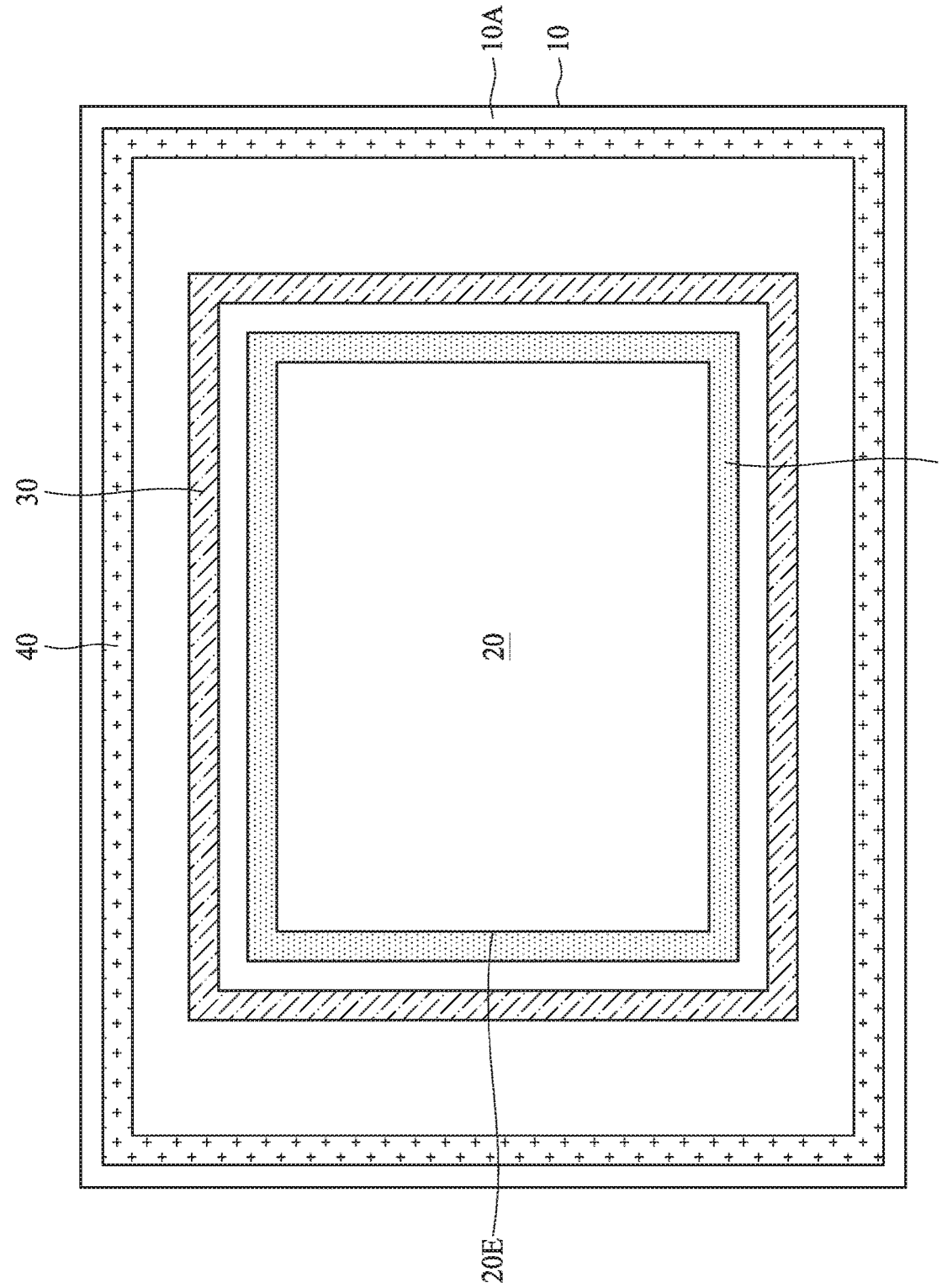
FIG. 4A and FIG. 4B are schematic views of a semiconductor device package according to one or more embodiments of the present disclosure.
Figure 4B:
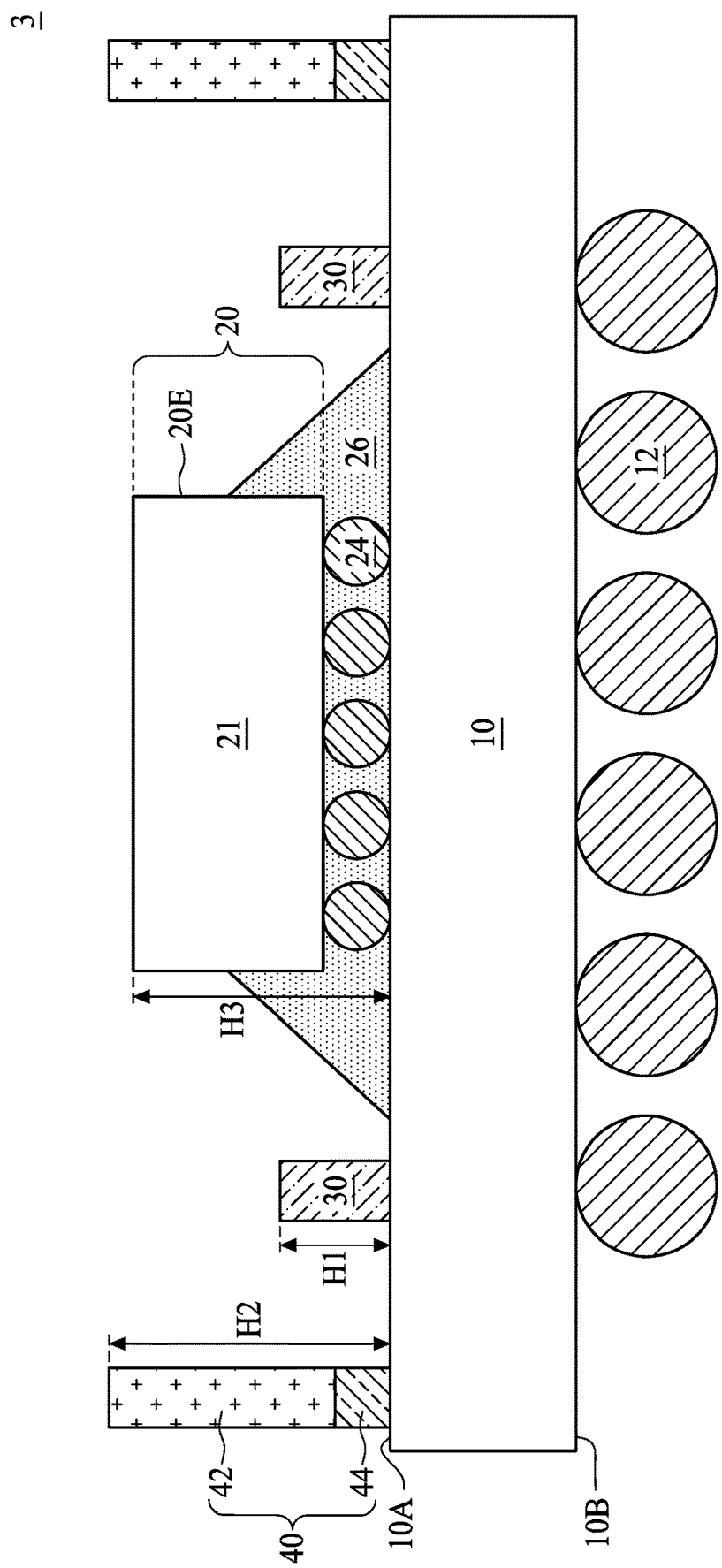

FIG. 4A and FIG. 4B are schematic views of a semiconductor device package according to one or more embodiments of the present disclosure, where FIG. 4A is a schematic top view, and FIG. 4B is a schematic cross-sectional view. As depicted in FIG. 4A and FIG. 4B, the underfill layer 26 of the semiconductor device package 3 may not be in contact with the first ring structure 30. In some embodiments, the first ring structure 30 is configured to compensate CTE mismatch between the underfill layer 26 and the substrate 10, and to compensate stress on the substrate 10, such that coplanarity (COP) of the substrate 10 is reduced. As a result, warpage of the substrate 10 can be alleviated, underfill crack risk can be reduced, and cold joint and bump crack of the first electrical conductors 24 between the semiconductor chip 20 and the substrate 10 can be alleviated or eliminated. In some embodiments, the semiconductor device package 3 may further include at least one passive component 28 over the surface 10A of the substrate 10. In some embodiments, the passive component 28 is disposed between the first ring structure 30 and the second ring structure 40.

Figure 5:
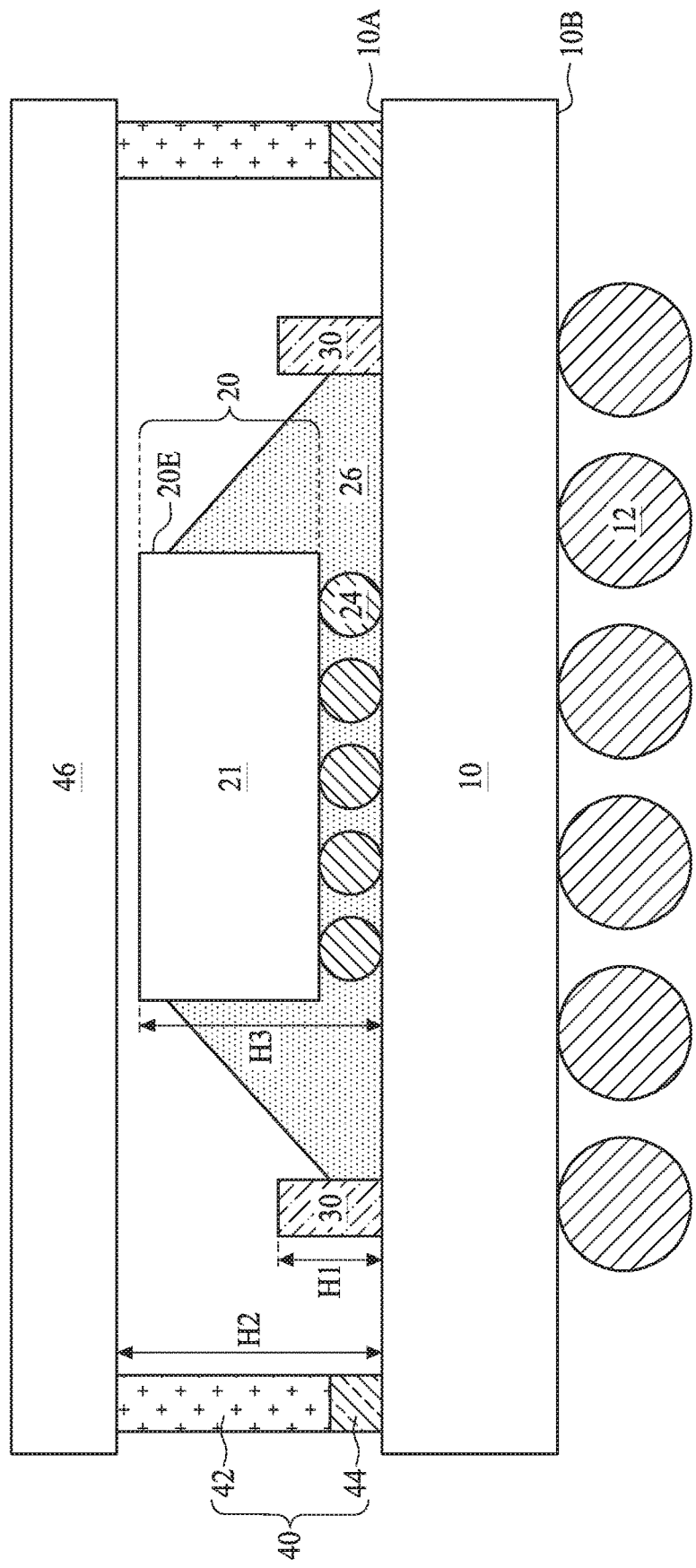
FIG. 5 is a schematic cross-sectional view of a semiconductor device package according to one or more embodiments of the present disclosure.

FIG. 5 is a schematic cross-sectional view of a semiconductor device package according to one or more embodiments of the present disclosure. As depicted in FIG. 5, the semiconductor device package 4 may further include a heat spreader 46 over the second ring structure 40. In some embodiments, the heater spreader 46 is configured to increase heat dissipation for the semiconductor chip 20. In some embodiments, the heat spreader 46 may include a metal heat spreader. In some embodiments, the heat spreader 46 is also configured to provide EMI shielding for the semiconductor device 20.

Figure 6A:
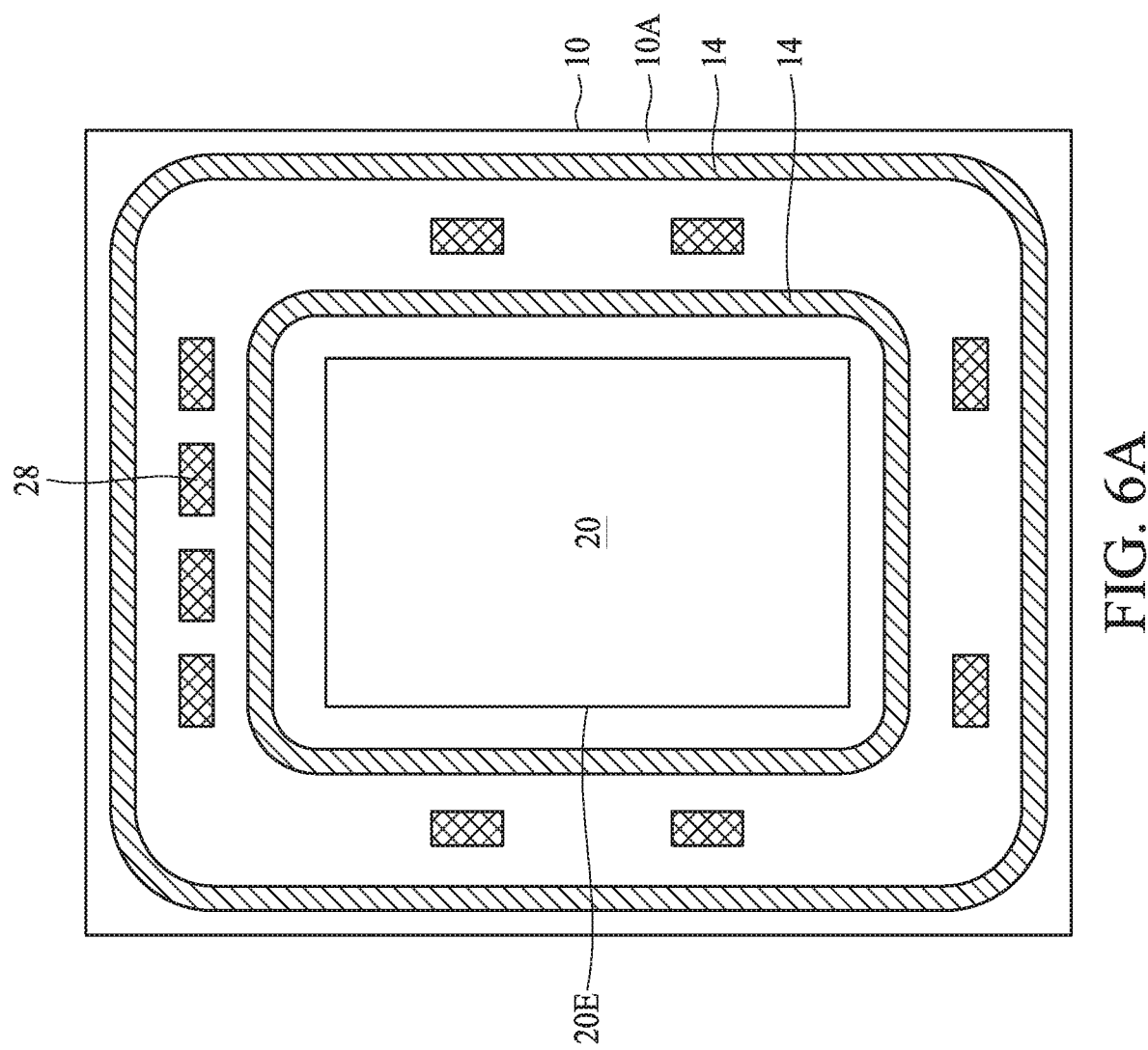
FIG. 6A, FIG. 6B, FIG. 6C and FIG. 6D are schematic views at one of various operations of manufacturing a semiconductor device package according to one or more embodiments of the present disclosure.
Figure 6B:
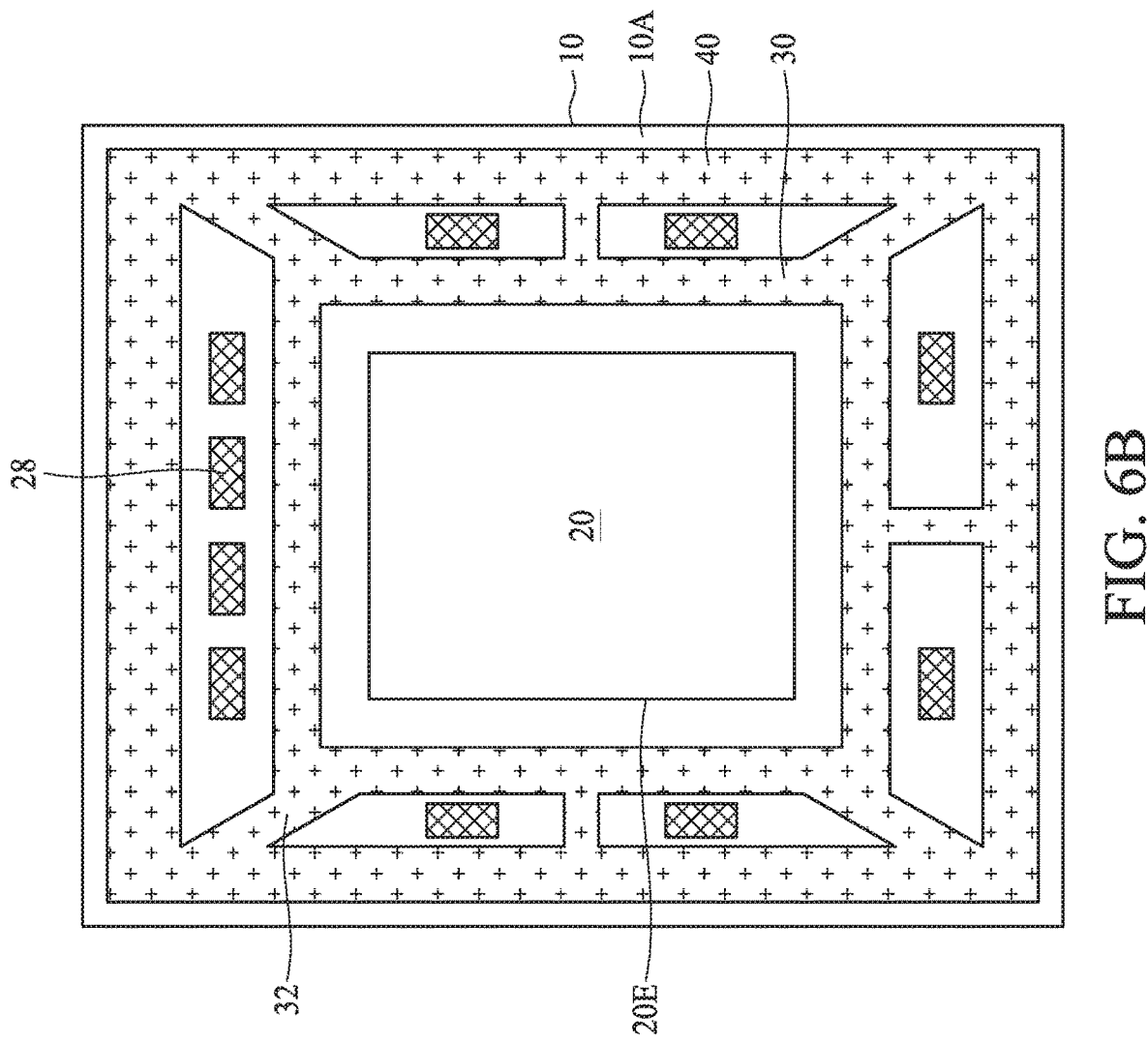
Figure 6C:
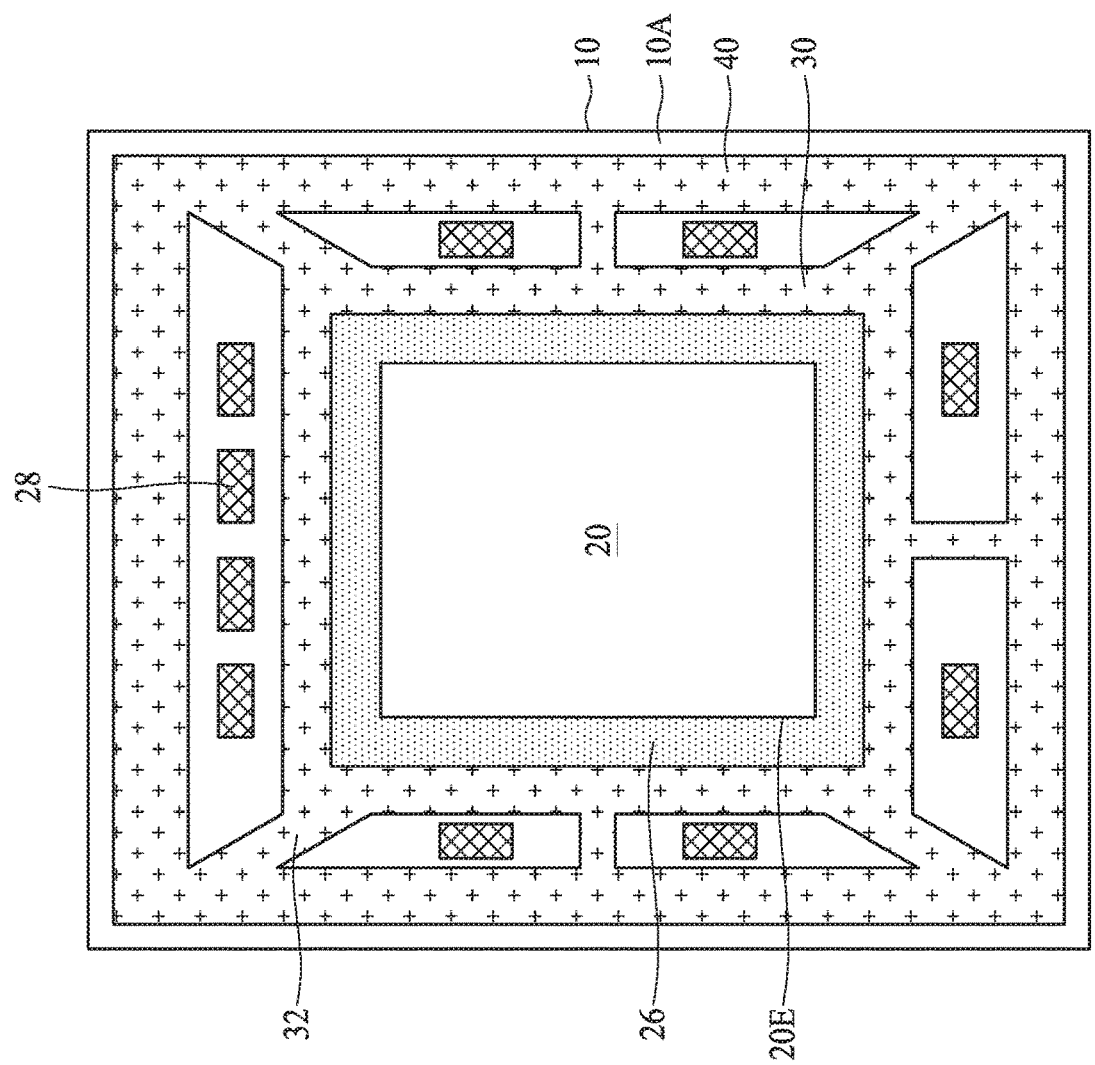
Figure 6D:
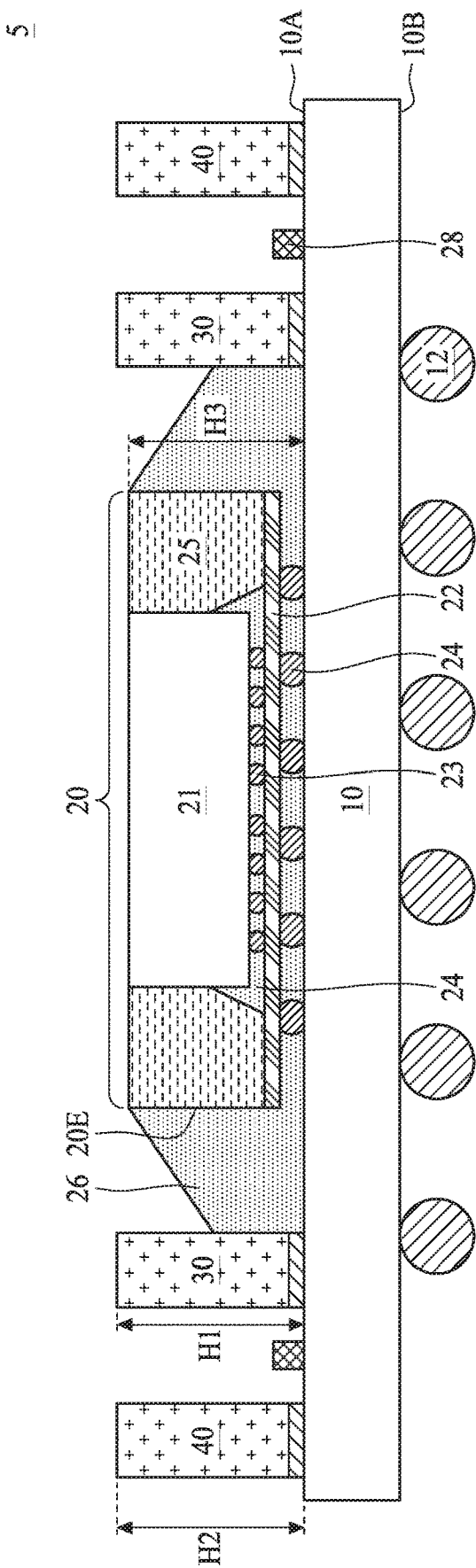

FIG. 6A, FIG. 6B, FIG. 6C and FIG. 6D are schematic views at one of various operations of manufacturing a semiconductor device package according to one or more embodiments of the present disclosure, where FIG. 6A, FIG. 6B and FIG. 6C are schematic top views, and FIG. 6D is a schematic cross-sectional view. As depicted in FIG. 6A, a substrate 10 is received. In some embodiments, the substrate 10 may include a semiconductor substrate, a package substrate, a printed circuit board (PCB) or the like. The substrate 10 includes a surface 10A and another surface 10B (shown in FIG. 6D) opposite to the surface 10A. In some embodiments, the substrate 10 includes a circuit layer such as through vias, conductive pillars, conductive posts, redistribution layer(s), or the like, or a combination thereof, configured to electrically interconnect different electronic devices disposed on the opposite surfaces 10A and 10B. One or more semiconductor chips 20 are disposed over the surface 10A of the substrate 10. In some embodiments, the semiconductor chip 20 is electrically connected to the substrate 10. In some embodiments, the semiconductor chip 20 is electrically connected to the substrate 10 through first electrical conductors 24. In some embodiments, the first electrical conductors 24 may include conductive bumps such as C4 bumps, conductive balls, conductive pastes, or the like. In some embodiments, the semiconductor chip 20 may be a chip-on-wafer (CoW) structure, but is not limited thereto. In some embodiments, the semiconductor chip 20 may include one or more semiconductor dies 21, another substrate 22, conductive structures 23, an underfill layer 24 and an encapsulant 25. In some embodiments, semiconductor die 21 is electrically connected to the substrate 22 through the conductive structures 23 such as conductive bumps. The underfill layer 24 is disposed between the semiconductor die 21 and the substrate 22, and surrounds the conductive structures 23. The encapsulant 25 encapsulates the semiconductor die 21. In some embodiments, passive component(s) 28 are disposed over the surface 10A of the substrate 10. In some embodiments, the passive components 28 may include resistor components, capacitor components, inductor components or combinations thereof. In some embodiments, an adhesive layer 14 is applied to the surface 10A of the substrate 10. In some embodiments, the adhesive layer 14 includes two ring-shaped patterns configured to attach ring structures to be formed. In some embodiments, the inner ring-shaped pattern of the adhesive layer 14 is between the semiconductor chip 20 and the passive components 28, and the outer ring-shaped pattern of the adhesive layer 14 is adjacent to a perimeter of the substrate 10.

It is appreciated that the sequences of formations of the semiconductor chip 20, the passive component 28 and the adhesive layer 14 may be exchanged. In some embodiments, the semiconductor chip 20 and the passive component 28 may be disposed over the surface 10A of the substrate 10 prior to formation of the adhesive layer 14. In some embodiments, the adhesive layer 14 may be applied to the surface 10A of the substrate 10 prior to formation of the semiconductor chip 20 and the passive component 28.

As depicted in FIG. 6B, a first ring structure 30 is formed over the inner ring-shaped pattern of the adhesive layer 14, and a second ring structure 40 is formed over the outer ring-shaped pattern of the adhesive layer 14. In some embodiments, the adhesive layer 14 may include a thermal-curable adhesive or a photo-curable adhesive, and a thermal curing or a photo curing may be performed to enhance adhesion between the first ring structure 30 and the substrate 10, and adhesion between the second ring structure 40 and the substrate 10. In some embodiments, the first ring structure 30 may include a continuous ring structure spaced from an edge 20E of the semiconductor chip 20, but substantially surrounding the edge 20E of the semiconductor chip 20. In some embodiments, the shape of the first ring structure 30 may include a rectangular ring, but not limited thereto. In some embodiments, the second ring structure 40 may include a continuous ring structure substantially aligned along the perimeter of the substrate 10. In some embodiments, the shape of the second ring structure 40 may include a rectangular ring, but not limited thereto.

In some embodiments, the first ring structure 30 and the second ring structure 40 are formed over the surface 10A of the substrate 10 with the adhesive layer 14. In some embodiments, the first ring structure 30 and the second ring structure 40 are formed concurrently. In some embodiments, the first ring structure 30 and the second ring structure 40 may include conductive ring structures such as metal ring structures or the like. In some embodiments, the first ring structure 30 may be grounded or supplied with a potential. In some embodiments, the second ring structure 40 may be grounded or supplied with a potential. In some embodiments, the first ring structure 30 and the second ring structure 40 may be electrically connected to each other. In some embodiments, the second ring structure 40 is configured to shield electromagnetic interference (EMI). In some embodiments, the second ring structure 40 is configured to provide heat dissipation for the semiconductor chip 20.

As depicted in FIG. 6C and FIG. 6D, an underfill layer 26 is formed between the semiconductor chip 20 and the substrate 10 to form a semiconductor device package 5. In some embodiments, second electrical conductors 12 may be formed over the surface 10B of the substrate 10. In some embodiments, the semiconductor device package 5 may be, but is not limited to, a chip-on-wafer-on-substrate (CoWoS) package. In some embodiments, the first ring structure 30 is configured as a dam to constrain the underfill layer 26 such that the underfill layer 26 may climb up to at least a portion of the edge 20E of the semiconductor chip 20, thereby helping to protect and fix the semiconductor chip 20. In some embodiments, the first ring structure 30 helps compensate CTE mismatch between the underfill layer 26 and the substrate 10, and helps compensate stress on the substrate 10, such that coplanarity (COP) of the substrate 10 can be reduced, i.e., the flatness of the substrate 10 is improved. As a result, warpage of the substrate 10 can be alleviated, underfill crack risk can be reduced, and cold joint and bump crack of the first electrical conductors 24 between the semiconductor chip 20 and the substrate 10 can be alleviated or eliminated. In some embodiments, the semiconductor device package 5 may further include rib structures 32 connected to the first ring structure 30 and the second ring structure 40. In some embodiments, the rib structures 32 are formed concurrently with the first ring structure 30 and the second ring structure 40. In some embodiments, the rib structures 32 are configured to help enhance robustness of the first ring structure 30 and the second ring structure 40. In some embodiments, the rib structures 32 are configured to compensate stress on the substrate 10. The area, shape, and arrangement of the rib structures 32 are not limited, and can be modified.

In some embodiments, the first ring structure 30 has a first height H1 measuring from the surface 10A of the substrate 10, the second ring structure 40 has a second height H2 measuring from the surface 10A of the substrate 10, and the semiconductor chip 20 has a third height H3 measuring from the surface 10A of the substrate 10. In some embodiments, the second height H2 of the second ring structure 40 is substantially equal to the first height H1 of the first ring structure 30, and the second height H2 of the second ring structure 40 and the first height H1 of the first ring structure 30 are higher than the third height H3 of the semiconductor chip 20. In some embodiments, the first height H1 of the first ring structure 30 may be substantially ranging from about 10 micrometers to about 1 millimeter, but is not limited thereto. In some embodiments, a heat spreader may be disposed over the first ring structure 30 and the second ring structure 40, and configured to help heat dissipation for the semiconductor chip 20.

Figure 7B:
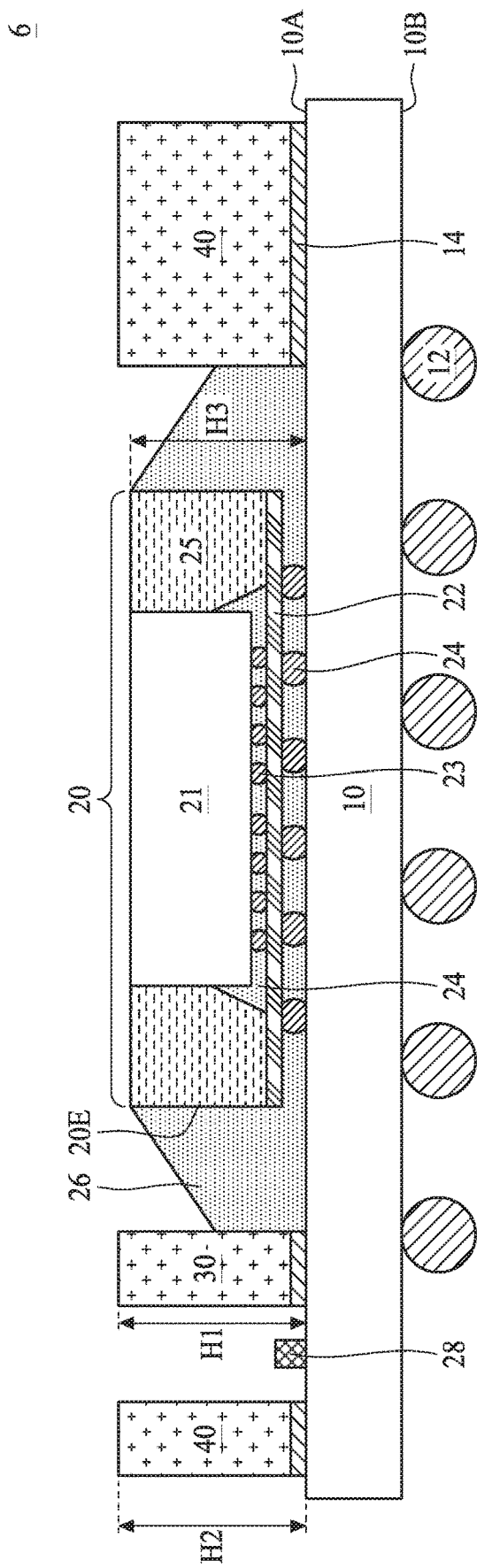

FIG. 7A and FIG. 7B are schematic views of a semiconductor device package according to one or more embodiments of the present disclosure, where FIG. 6A is a schematic top view, and FIG. 6B is a schematic cross-sectional view. As depicted in FIG. 6A and FIG. 6B, different from the semiconductor device package 5 in FIG. 6C and FIG. 6D, the patterns of the first ring structure 30 and the second ring structure 40 of the semiconductor device package 6 are modified. In some embodiments, the passive components 28 are not disposed at all sides of the semiconductor chip 20, and the first ring structure 30 and the second ring structure 40 may be integrated to connect to each other. In some embodiments, the passive components 28 are disposed at one side of the semiconductor chip 20, the first ring structure 30 and the second ring structure 40 at this side of the semiconductor chip 20 are spaced from each other to allocate the passive components 28, while the first ring structure 30 and the second ring structure 40 at the other sides of the semiconductor chip 20 may be connected.

In some embodiments of the present disclosure, the semiconductor device package includes a ring structure configured as a dam to constrain an underfill layer such that the underfill layer may not bleed to a passive component. The ring structure may help to reduce the amount and area of the underfill layer, and may alleviate the stress on the substrate induced by the underfill layer. The ring structure may also help the underfill layer to climb up to the edge of the semiconductor chip, and thus helps to protect and fix the semiconductor chip. The ring structure also helps compensate CTE mismatch between the underfill layer and the substrate, and helps compensate stress on the substrate, such that coplanarity (COP) of the substrate can be reduced. By virtue of the ring structure, warpage of the substrate can be alleviated, underfill crack risk can be reduced, and cold joint and bump crack between the semiconductor chip and the substrate can be alleviated or eliminated.

In one exemplary aspect, a semiconductor device package includes a substrate, a semiconductor chip, a first ring structure and a second ring structure. The substrate includes a surface. The semiconductor chip is over the surface of the substrate. The first ring structure is over the surface of the substrate. The second ring structure is over the surface of the substrate, wherein the first ring structure is between the semiconductor chip and the second ring structure.

In another aspect, a semiconductor device package includes a substrate, a semiconductor chip, at least one passive component and a first ring structure. The substrate includes a surface. The semiconductor chip is over the surface of the substrate. The at least one passive component is over the surface of the substrate. The first ring structure is over the surface of the substrate and between the semiconductor chip and the at least one passive component.

In yet another aspect, a method for manufacturing a semiconductor device package is provided. A substrate is received. A semiconductor chip is disposed over a surface of the substrate. A first ring structure is formed over the surface of the substrate. A second ring structure is formed over the surface of the substrate, wherein the first ring structure is between the semiconductor chip and the second ring structure.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device package, comprising:
   a substrate including a surface;
   a semiconductor chip over the surface of the substrate;
   an underfill layer between the semiconductor chip and the substrate, and climbing at least a portion of an edge of the semiconductor chip, wherein the underfill layer is in contact with a bottom surface of the semiconductor chip;
   a first ring structure over the surface of the substrate, wherein a material of the first ring structure is insulative; and
   a second ring structure over the surface of the substrate, wherein the first ring structure is between the semiconductor chip and the second ring structure, the second ring structure comprises a conductive ring structure and an adhesive layer, the conductive ring structure is physically separated and electrically isolated from the substrate by the adhesive layer, and a width of the adhesive layer is substantially the same as a width of the conductive ring structure;
   wherein the first ring structure has a height measuring from the surface of the substrate to an upmost surface of the first ring structure, the semiconductor chip has a height measuring from the surface of the substrate to an upmost surface of the semiconductor chip, the second ring structure has a height measuring from the surface of the substrate to an upmost surface of the second ring structure, the upmost surface of the first ring structure and the upmost surface of the second ring structure are in different levels, the height of the first ring structure is lower than the height of the semiconductor chip, and the underfill layer is distinct and separated from the first ring structure.

2. The semiconductor device package of claim 1, further comprising at least one passive component between the first ring structure and the second ring structure.

3. The semiconductor device package of claim 1, wherein the underfill layer is in contact with the first ring structure.

4. The semiconductor device package of claim 1, wherein the underfill layer is spaced from the first ring structure.

5. The semiconductor device package of claim 1, wherein the height of the second ring structure is higher than the height of the semiconductor chip.

6. The semiconductor device package of claim 1, wherein the height of the first ring structure is lower than the height of the second ring structure.

7. The semiconductor device package of claim 6, wherein the first ring structure comprises a polymer ring structure.

8. The semiconductor device package of claim 1, wherein the first ring structure and the second ring structure are connected to each other.

9. The semiconductor device package of claim 1, further comprising a heat spreader over the second ring structure.

10. The semiconductor device package of claim 1, further comprising a plurality of electrical conductors between and electrically connected to the bottom surface of the semiconductor chip and the surface of the substrate, wherein the underfill layer surrounds the electrical conductors.

11. The semiconductor device package of claim 1, wherein an upper surface of the semiconductor chip is uncovered by the underfill layer.

12. A semiconductor device package, comprising:
    a substrate including a surface;
    a semiconductor chip over the surface of the substrate;
    at least one passive component over the surface of the substrate;

an insulative first ring structure over the surface of the substrate and between the semiconductor chip and the at least one passive component, wherein the insulative first ring structure has a height measuring from the surface of the substrate to an upmost surface of the insulative first ring structure, the semiconductor chip has a height measuring from the surface of the substrate to an upmost surface of the semiconductor chip, the height of the insulative first ring structure is lower than the height of the semiconductor chip, the insulative first ring structure is separated from the passive component; and an underfill layer between the semiconductor chip and the substrate, wherein the underfill layer is distinct and separated from the insulative first ring structure, wherein an upmost surface of the passive component is lower than the upmost surface of the semiconductor chip and lower than the upmost surface of the insulative first ring structure.

13. The semiconductor device package of claim 12, further comprising a second ring structure over the surface of the substrate, wherein the at least one passive component is between the insulative first ring structure and the second ring structure.

14. The semiconductor device package of claim 13, further comprising a plurality of rib structures connected to the insulative first ring structure and the second ring structure.

15. The semiconductor device package of claim 12, wherein the underfill layer climbs at least a portion of an edge of the semiconductor chip.

16. A method of manufacturing a semiconductor device package, comprising:

receiving a substrate;

disposing a semiconductor chip over a surface of the substrate, wherein a bottom surface of the semiconductor chip and the surface of the substrate is separated with a space;

forming an insulative first ring structure over the surface of the substrate, wherein the insulative first ring structure has a height measuring from the surface of the substrate to an upmost surface of the insulative first ring structure, the semiconductor chip has a height measuring from the surface of the substrate to an upmost surface of the semiconductor chip, and the height of the insulative first ring structure is lower than the height of the semiconductor chip;

forming a second ring structure over the surface of the substrate, wherein the insulative first ring structure is between the semiconductor chip and the second ring structure, the second ring structure has a height measuring from the surface of the substrate to an upmost surface of the second ring structure, and the upmost surface of the insulative first ring structure and the upmost surface of the second ring structure are in different levels, the second ring structure comprises a conductive ring structure and an adhesive layer, the conductive ring structure is physically separated and electrically isolated from the substrate by the adhesive layer, and a width of the adhesive layer is substantially the same as a width of the conductive ring structure; and forming an underfill layer in the space between the bottom surface of the semiconductor chip and the surface of the substrate, wherein the underfill layer is distinct and separated from the insulative first ring structure.

17. The method of claim 16, wherein the forming the insulative first ring structure over the surface of the substrate comprises:

selectively dispensing a photo-curable material over the surface of the substrate and irradiating the photo-curable material simultaneously.

18. The method of claim 16, wherein the forming the second ring structure over the surface of the substrate comprises:

attaching the conductive ring structure to the surface of the substrate with the adhesive layer.

19. The method of claim 16, further comprising forming a plurality of rib structures connected to the insulative first ring structure and the second ring structure over the surface of the substrate.

20. The method of claim 19, wherein the plurality of rib structures are formed concurrently with the insulative first ring structure and the second ring structure.

* * * * *